(12) United States Patent
Murayama

(10) Patent No.: US 6,522,022 B2
(45) Date of Patent: Feb. 18, 2003

(54) MOUNTING STRUCTURE FOR SEMICONDUCTOR DEVICES

(75) Inventor: Kei Murayama, Nagano (JP)

(73) Assignee: Shinko Electric Industries Co., Ltd., Nagano (JP)

(*) Notice: Subject to any disclaimer, the term of this patent is extended or adjusted under 35 U.S.C. 154(b) by 0 days.

(21) Appl. No.: 09/996,643

(22) Filed: Nov. 27, 2001

(65) Prior Publication Data

US 2002/0113303 A1 Aug. 22, 2002

(30) Foreign Application Priority Data

Dec. 18, 2000 (JP) ........................................ 2000-383746

(51) Int. Cl.[7] .................. H01L 23/48; H01L 23/52; H01L 29/40
(52) U.S. Cl. .................. 257/786; 257/780; 257/777
(58) Field of Search ................. 257/686, 685, 257/777, 780, 781; 438/109, 368, 426, FOR 368

(56) References Cited

U.S. PATENT DOCUMENTS 4,807,021 A * 2/1989 Okumura et al.
5,614,766 A * 3/1997 Takasu et al.
5,854,507 A * 12/1998 Miremadi et al.
6,239,496 B1 * 5/2001 Asada et al.

* cited by examiner

Primary Examiner—Sheila V. Clark
(74) Attorney, Agent, or Firm—Paul & Paul

(57) ABSTRACT

A mounting structure for semiconductor devices wherein a plurality of semiconductor devices each comprised of a semiconductor chip carried on a substrate and provided with connection terminals formed in bump shapes on the substrate are stacked in multiple layers in the vertical direction and mounted on a mounting substrate by electrically connecting the adjoining semiconductor devices through the connection terminals, wherein the connection terminals of the adjoining semiconductor devices are arranged to overlap each other and the connection terminals of the adjoining semiconductor devices are arranged to be displaced from each other in planar arrangement, which thereby eases the stress acting on connection terminals when mounting semiconductor devices stacked on a mounting substrate and improves the reliability of connection between the semiconductor devices and mounting substrate.

7 Claims, 4 Drawing Sheets

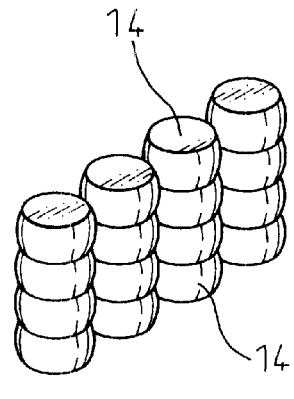
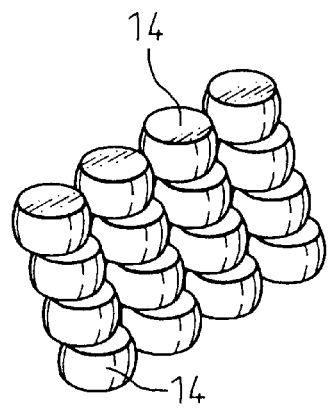
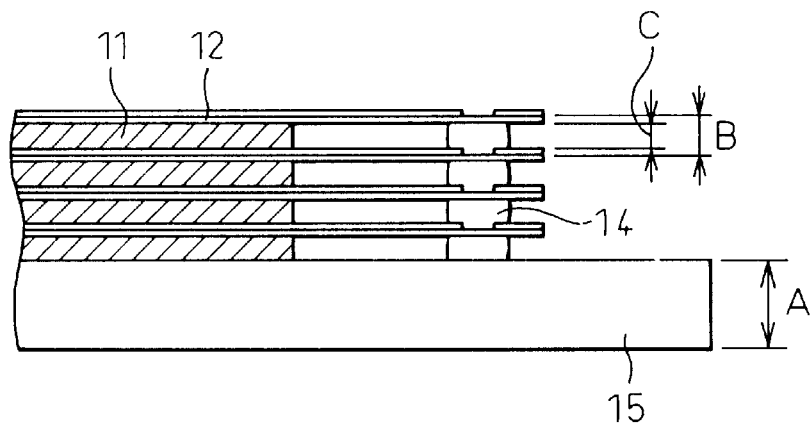
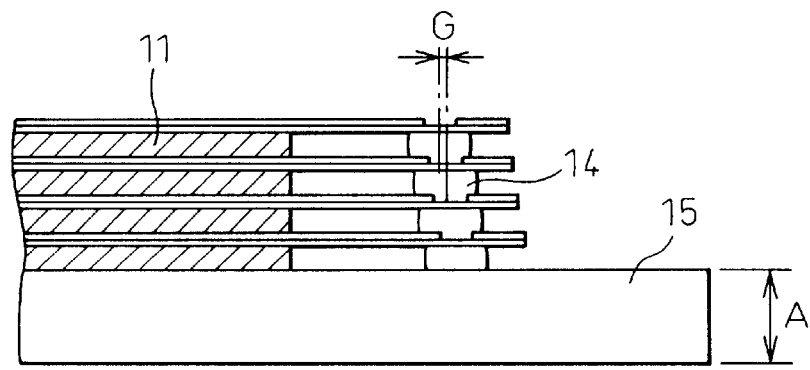

MOUNTING STRUCTURE FOR SEMICONDUCTOR DEVICES

BACKGROUND OF THE INVENTION

1. Field of the Invention

The present invention relates to a mounting structure for semiconductor devices, more particularly relates to a mounting structure for semiconductor devices for mounting a plurality of semiconductor devices stacked together.

2. Description of the Related Art

One method of mounting semiconductor devices on a mounting substrate is to mount a plurality of semiconductor devices stacked on each other. This mounting method has the advantages of enabling semiconductor devices to be efficiently mounted in a set planar region and enabling the length of the interconnection patterns to be shortened compared with the case of arranging semiconductor devices planarly and therefore enabling the increasing speed of signals to be handled. Recently, extremely thin semiconductor chips of several tens of pm to 200 μm have been provided. Therefore, the method of mounting semiconductor devices stacked on each other is effective from the viewpoint of enabling application even to products limited in thickness.

FIG. 8 is an explanatory view of an ordinary mounting method for mounting semiconductor devices 10 stacked on each other. In the FIG. 11 represents a semiconductor chip 12 a substrate on which a semiconductor chip 11 is placed, 14 a connection terminal formed in a bump shape for bonding substrates 12 stacked together, and 15 a mounting substrate. In the illustrated example, each semiconductor chip 11 is bonded to a substrate 12 by an anistropic conductive adhesive 16 and is electrically connected to first ends of interconnection patterns 20 formed on the surface of the substrate 12 through gold bumps 18. The connection terminals 14 are electrically connected to the second ends of the interconnection patterns 20 formed on the substrate 12 and are electrically connected to interconnection patterns 20 of an adjoining substrate 12 through connection holes 22 formed in the substrate in register with the positions of arrangement of the connection terminals 14.

Summarizing the problem to be solved the invention, when stacking semiconductor devices 10 carrying semiconductor chips 11 on substrates 12, normally, as shown in FIG. 8, the planar arrangements of the connection terminals 14 of the stacked semiconductor devices 10 are made the same and connection terminals 14 are designed to project vertically from the mounting surface of the mounting substrate 15 when the semiconductor devices 10 are stacked.

When making the planar arrangement of the connection terminals 14 of each layer the same and stacking semiconductor devices 10 so that the connection terminals 14 project out as completely straight columns, stress easily concentrates at the connection terminals 14 and the reliability of the bonds between the mounting substrate 15 and connection terminals 14 falls.

The problem of the deterioration of the reliability of the bonds between the mounting substrate 15 and the connection terminals 14 arises due to the difference in the heat expansion coefficients of the mounting substrate 15 and semiconductor devices 10 (semiconductor chips 11, substrates 12, and anistropic conductive adhesive 16). When stacking semiconductor devices in multiple layers, reducing the stress concentration at the bonds of the mounting substrate and the connection terminals and the stress concentration between the mounting substrate and the semiconductor devices as much as possible becomes important in improving the reliability of the finished product.

SUMMARY OF THE INVENTION

An object of the present invention is to solve the problem when mounting semiconductor devices stacked on a mounting substrate and provide a mounting structure for semiconductor devices of a high reliability which eases the stress concentration occurring between the mounting substrate and the connection pads of the semiconductor devices when mounting semiconductor devices stacked together.

To achieve this object, the present invention provides a mounting structure for semiconductor devices wherein a plurality of semiconductor devices each comprised of a semiconductor chip carried on a substrate and provided with connection terminals formed in bump shapes on the substrate are stacked in multiple layers in the vertical direction and mounted on a mounting substrate by electrically connecting the adjoining semiconductor devices through the connection terminals, wherein the connection terminals of the adjoining semiconductor devices are arranged to overlap each other and the connection terminals of the adjoining semiconductor devices are arranged to be displaced from each other in planar arrangement.

In one preferred embodiment, the connection terminals are arranged successively displaced inside from the semiconductor device of the bottommost layer mounted on the mounting substrate to the semiconductor device of the topmost layer.

In another preferred embodiment, the connection terminals are arranged successively displaced outside from the semiconductor device of the bottommost layer mounted on the mounting substrate to the semiconductor device of the topmost layer.

In still another preferred embodiment, the connection terminals are arranged inside and outside from the semiconductor device of the bottommost layer mounted on the mounting substrate to the semiconductor device of the topmost layer.

In still another preferred embodiment, the semiconductor chips and connection terminals are arranged on the same surface of the substrate.

In still another preferred embodiment, the semiconductor chips and connection terminals are arranged on opposite surfaces of the substrate.

In the above preferred embodiments, each of the semiconductor device is formed with interconnection patterns on one surface of its substrate and connection terminals of the adjoining semiconductor devices are electrically connected with the interconnection patterns through connection holes formed passing through the substrates.

BRIEF DESCRIPTION OF THE DRAWINGS

These and other objects and features of the present invention will become clearer from the following description of the preferred embodiments given with reference to the attached drawings, wherein.

Figure 5:
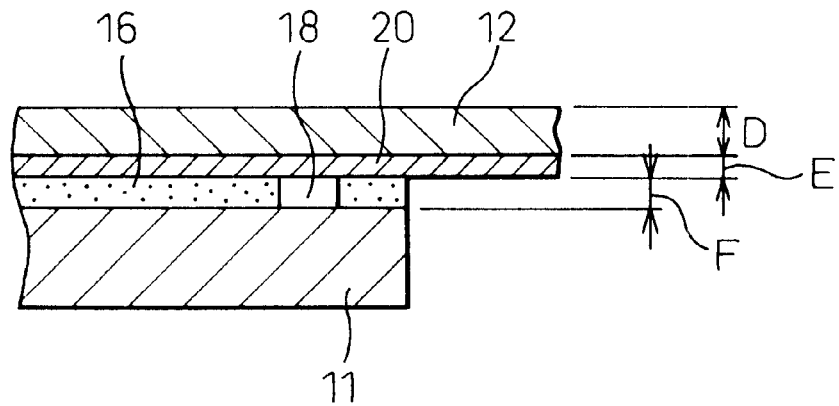
Figure 6:
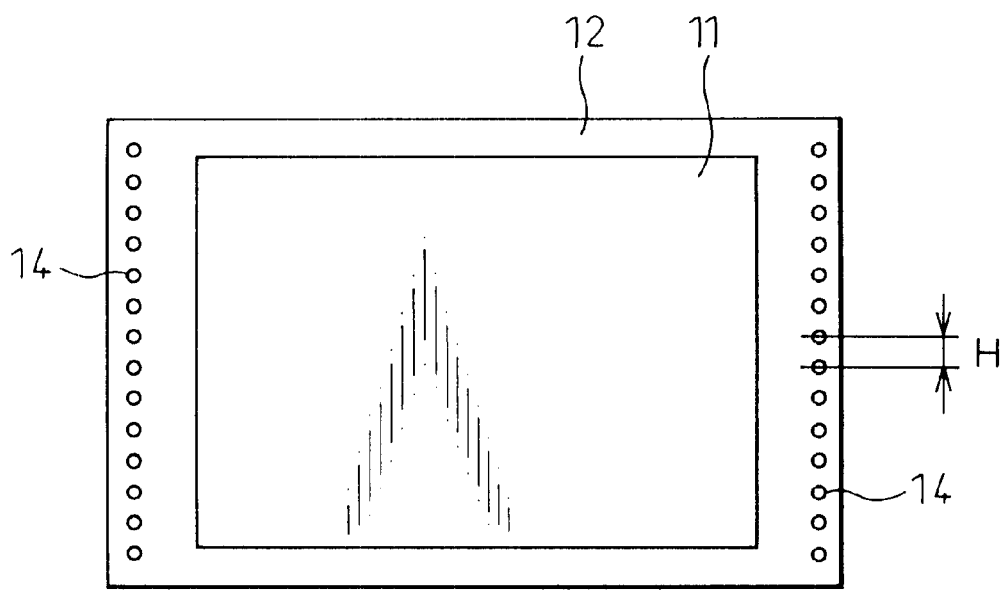
Figure 7:
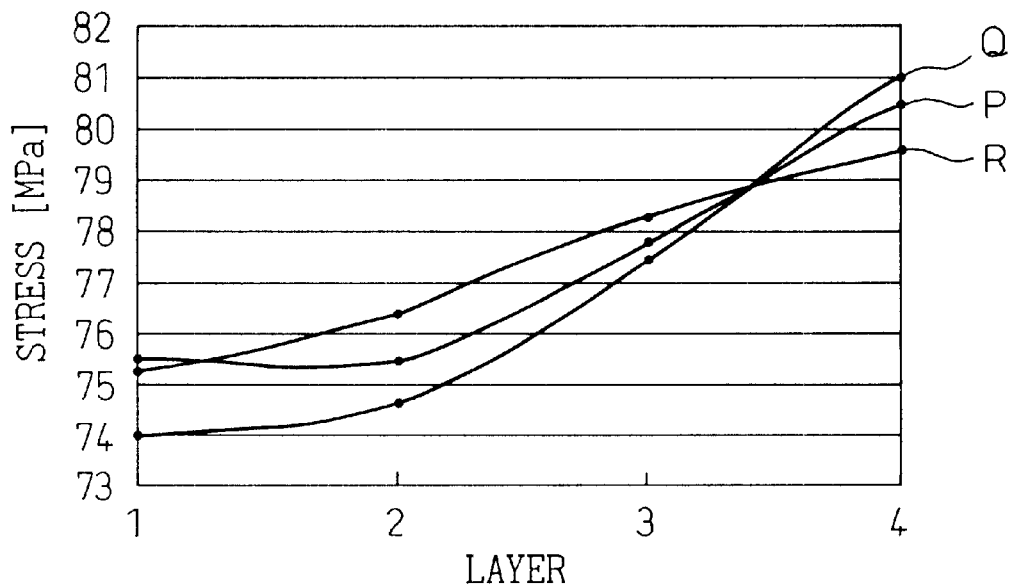
Figure 8:
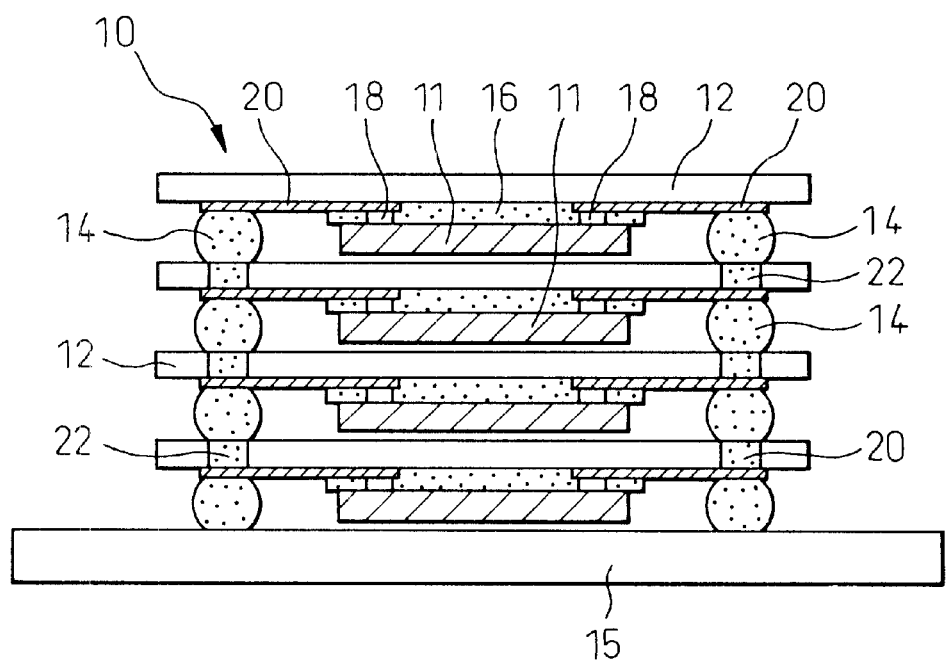

FIGS, 3A and 3B are perspective views of 3D arrangements of connection terminals;

FIGS. 4A and 4B are sectional views of mounting structures for semiconductor devices used for calculation of stress;

FIG. 5 is an enlarged sectional view of a mounting structure for semiconductor devices used for calculation of stress;

FIG. 6 is a plan view of a mounting structure for semiconductor devices used for calculation of stress;

FIG. 7 is a graph of the results of calculation of the stress acting on semiconductor chips; and FIG. 8 is a sectional view of a conventional mounting structure for mounting semiconductor devices

DESCRIPTION OF THE PREFERRED EMBODIMENTS

Next, preferred embodiments of the mounting structure for semiconductor devices according to the present invention will be explained.

Figure 1:
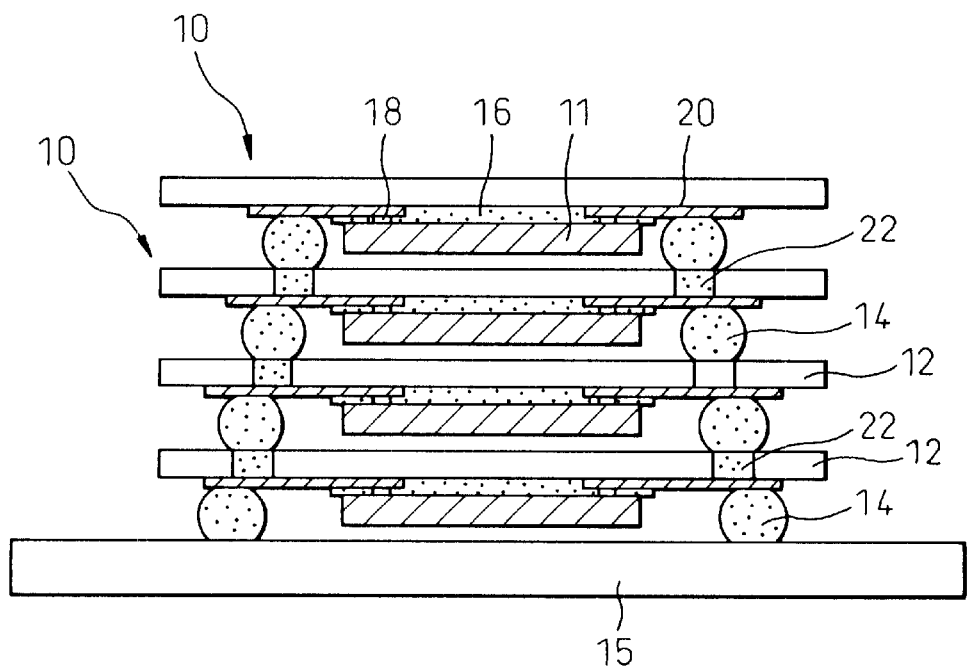
FIG. 1 is a sectional view of an embodiment of a mounting structure for semiconductor devices according to the present invention.
Figure 2:
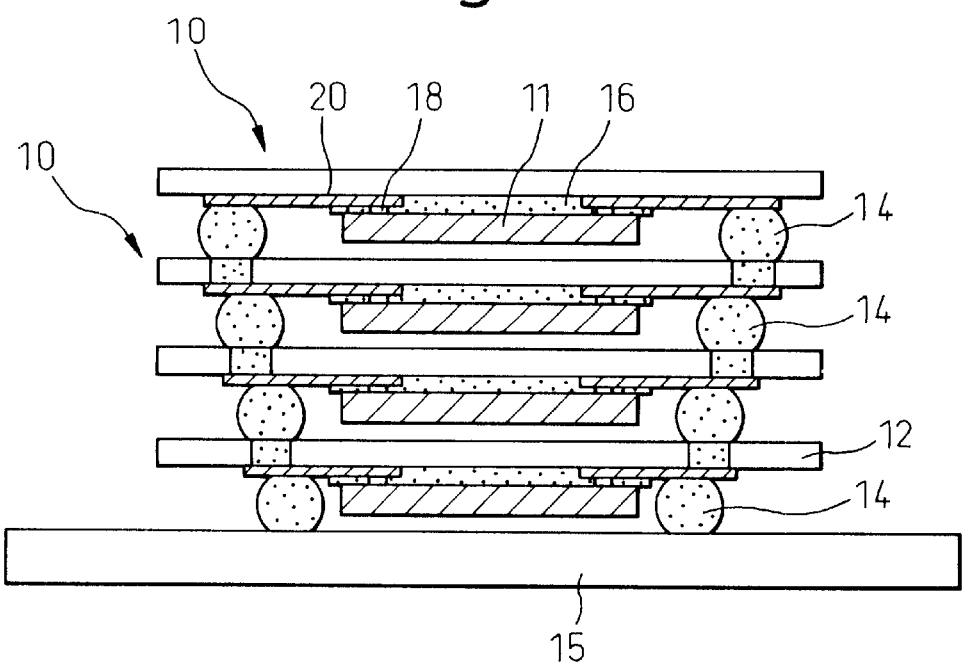
FIG. 2 is a sectional view of another embodiment of a mounting structure for semiconductor devices according to the present invention.

FIGS. 1 and 2 are views for explaining embodiments of the mounting structure for semiconductor devices according to the present invention. The mounting structure for semiconductor devices shown in FIG. 1 stacks the semiconductor devices 10 on the mounting substrate 15 with the centers of the connection terminals in the planes of semiconductor devices 10 of top layers arranged to be gradually displaced inward from the center positions of the connection terminals 14 of the bottom layers. In other words, four types of semiconductor devices 10 differing in distance between the facing sides of the connection terminals 14 are prepared and the semiconductor devices 10 stacked in an array by which the distance between connection terminals 14 becomes narrower with each layer successively from the bottom layer to thereby mount them on the mounting substrate 15.

In the mounting structure for semiconductor devices shown in FIG. 1, each of the semiconductor devices 10 is formed with interconnection patterns 20 on one surface of its substrate 12, has a semiconductor chip 11 carried on the one surface of the substrate 12 formed with the interconnection patterns 20, and electrically connects the semiconductor chip 11 and interconnection patterns 20 through an anistropic conductive adhesive 16 and gold bumps 18. At the other surface of the substrate 12 are formed connection holes 22 in register with the portions at which the connection terminals 14 of the semiconductor device of the adjoining layer will be bonded. The connection terminals 14 of the semiconductor device 10 of the adjoining layer are designed to be electrically connected through these connection holes 22. With semiconductor memory devices etc., the terminals of the semiconductor devices are connected in common. The configuration of this embodiment is optimal for the case of such a mounting structure.

In this embodiment, the connection terminals 14 of adjoining layers are arranged so as to partially overlap in planar arrangement so as to electrically connect the semiconductor devices 10 of the adjoining layers. When electrically connecting the semiconductor devices 10 of adjoining layers through the connection terminals 14, by suitably laying out the interconnection patterns, it is not necessarily required to arrange the connection terminals of the adjoining layers to overlap in planar arrangement. In this embodiment, the connection terminals 14 of the adjoining layers are set to overlap in planar arrangement so as to enable easy electrical connection of the interconnection patterns formed on one surface of a substrate 12 and the connection terminals 14 of the adjoining layer through the connection holes 22.

The mounting structure for semiconductor devices shown in FIG. 2, opposite to the mounting structure for semiconductor devices shown in FIG. 1, has the distance between facing sides of the connection terminals 14 of the semiconductor devices 10 of the bottom layers set narrower than the distance between facing sides of the connection terminals 14 of the semiconductor devices 10 of the top layers and has the center positions of the connection terminals 14 of the semiconductor devices of the adjoining layers arranged to be gradually displaced to the outside of the substrate 12 from the bottom layer to the top layer. The connection terminals 14 of the adjoining layers are arranged so as to partially overlap in planar arrangement in the same way as in the above embodiment.

Note that when mounting semiconductor devices 10 stacked on the mounting substrate 15, in the above embodiments, the semiconductor chips 11 were bonded to the substrates 12 by the anistropic conductive adhesive 16, but the method of carrying the semiconductor chips 11 on the substrates 12 is not limited to this. For example, it is of course also possible to mount them by flip-chip bonding using solder bumps. Further, the material etc. of the substrates 12 carrying the semiconductor chips 11 are not particularly limited. When using polyimide or another plastic film for the substrates 12, it is possible to reduce the thickness of the substrates 12, so there is the advantage that the overall thickness can be reduced in the state with a plurality of semiconductor devices 10 stacked.

As shown in FIGS. 1 and 2, when mounting semiconductor devices 10 stacked through connection terminals 14, the advantage of the method of bonding by stacking so that the connection terminals 14 are slightly tilted with respect to the mounting surface of the mounting substrate 15 is that when bonding by stacking the connection terminals 14 tilted, the stress acting on the connection terminals 14 can be relieved compared with the case of bonding by stacking the connection terminals 14 vertical to the mounting surface of the mounting substrate 15.

FIGS. 3A and 3B are explanatory views of 3D arrangements of the connection terminals 14 in the state with the semiconductor devices 10 stacked on the mounting substrate 15. FIG. 3A corresponds to the arrangement in FIG. 8 and shows the state with the connection terminals 14 stacked vertically on the mounting surface of the mounting substrate 15. FIG. 3B corresponds to the arrangement in FIG. 1 and shows the state of bonding by displacing the connection terminals of top layers displaced inside from the connection terminals 14 of the bottom layers and by stacking the connection terminals 14 at a slight tilt with respect to the mounting surface of the mounting substrate 15.

Next, an explanation will be given of an example of concretely calculating what degree of stress acts on the connection terminals 14 and the semiconductor chips 11 carried on the substrates 12 when mounting semiconductor devices 10 stacked via connection terminals 14.

The stress was calculated for the mounting structures of the semiconductor devices shown in FIGS. 1, 2, and 8. FIGS. 4A and 4B show conditions of thickness and arrangement of different parts in the calculation of stress. FIG. 4A shows a comparative example, while FIG. 4B shows the configuration of Example 1 corresponding to FIG. 1. FIG. 5 shows an enlarged view.

The conditions of the different parts are as follows, that is, a thickness A of the mounting substrate 15 of 0.8 mm, a distance B between layers (height of connection terminals 14) of 280 µm, a thickness D of the substrates 12 comprised of polyimide of 25 µm, a thickness E of interconnection patterns 20 comprised of copper of 15 µm, and a thickness (thickness of anistropic conductive adhesive) F of the gold bumps 18 of 30 µm.

In FIG. 4B, the connection terminals 14 are displaced toward the inside the further toward the top. The amount of displacement G between the layers of the connection terminals 14 is 50 µm. Note that even in the case of Example 2 corresponding to FIG. 2, the amount of displacement between layers of the connection terminals 14 was made 50 µm.

FIG. 6 shows the conditions of the planar arrangement etc. of a substrate 12 and semiconductor chip 11 in the stress calculation. In the stress calculation, the vertical and horizontal planar dimensions of the substrate 12 were 12 mm vertical and 20 mm horizontal. The semiconductor chip 11 was made one of a vertical dimension of 10 mm and horizontal dimension of 15 mm. The pitch H between adjoining connection terminals 14 was 0.8 mm, the diametrical dimension of the land portions connecting the connection terminals 14 was 500 µm, and the diametrical dimension of the portions where the lands are exposed at the surface (connection holes 22) was 300 µm. Further, the pitch of the facing connection terminals was 18.5 mm.

Note that as shown in FIGS. 1 and 2, in the mounting structure for semiconductor devices of this embodiment, since the positions of arrangement of the connection terminals 14 are displaced, in the calculation of stress, the condition is set that the positions of arrangement of the connection terminals 14 of the bottommost layer bonded to the mounting substrate 15 be the same. Arranging the connection terminals 14 of the bottommost layers bonded to the mounting substrate 15 the same means that in the embodiment corresponding to FIG. 1, the positions of the connection terminals 14 are displaced toward the inside from the common positions the further to the top while in the embodiment corresponding to FIG. 2, the positions of the connection terminals 14 are displaced toward the outside the further to the top.

Table 1 shows values set as conditions for physical properties of the different parts in the stress calculation. Here, an epoxy based plastic substrate is used as the mounting substrate 15, a polyimide film as the substrates 12, copper as the interconnection patterns 20, and silver-tin solder as the connection terminals 14.

TABLE 1

| Member | Young's modulus (MPa) | Poisson's ratio | Heat expansion coefficient (ppm/° C.) |
| --- | --- | --- | --- |
| Semiconductor chips | 200,100 | 0.33 | 3.4 |
| Bonding tape | 3,000 | 0.40 | 39.00 |
| Substrate | 8,800 | 0.30 | 12.0 |
| Interconnection patterns | 117,700 | 0.34 | 17.2 |
| Connection terminals | 46,440 | 0.40 | 25.4 |
| Mounting substrate | 18,600 | 0.19 | 14.9 |

Table 2 shows the results of calculation of the stress acting on the connection terminals 14 under the above conditions. The comparative example corresponds to the conventional example shown in FIG. 8, Example 1 corresponds to the example shown in FIG. 1, and Example 2 corresponds to the example shown in FIG. 2. Note that the stress acting on the connection terminals 14 differs somewhat by the positions of arrangement of the connection terminals 14. The values shown in Table 2 show the stress acting on the connection terminals 12 arranged at the endmost parts among the connection terminals 12 arranged in a line at the bottommost layer bonded to the mounting substrate 15. As the stress acting on the connection terminals 14, the one acting on the connection terminals 14 arranged at the endmost parts becomes the largest. Table 2 shows the maximum stress acting on these connection terminals 14.

TABLE 2

| Calculated value of stress | Stress (MPa) |
| --- | --- |
| Comparative Example | 728 |
| Example 1 | 617 |
| Example 2 | 693 |

The results shown in Table 2 shows that according to the mounting structures for semiconductor devices according to Examples 1 and 2, under the above conditions, it is possible to reduce the stress acting on the connection terminals 14 compared with the conventional mounting structure for semiconductor devices. That is, when mounting the semiconductor devices, 10 stacked through connection terminals 14, it is shown that it is possible to reduce the stress acting on the connection terminals 14 more by the method of stacking the connection terminals 14 of the adjoining layers displaced to the inside or the outside than by the method of bonding by stacking the connection terminals 14 straight.

This means that when bonding by stacking the connection terminals 14, displacing the connection terminals 14 acts to disperse and relieve the stress. That is, when bonding by stacking the connection terminals 14, displacing the bonding positions of the connection terminals 14 from each other enables the stress to be relieved. Therefore, by utilizing this bonding method, it is possible to reduce the stress acting on the connection terminals at the time of mounting the semiconductor devices stacked and possible to prevent cracks from occurring at the bonds between the connection terminals of the semiconductor devices and mounting structures and thereby to improve the reliability of the finished product.

FIG. 7 is a graph of the results of calculation of the stress acting on the individual semiconductor chips 11 carried from the first layer (bottommost layer) to the fourth layer under the above conditions. In the figure, the curve P shows the results of calculation for Comparative Example and the curves Q and R show the results of calculation for Examples 1 and 2. Looking at the results of FIG. 7, for Example 1, the stress acting on the semiconductor chips from the first layer to the third layer becomes smaller than in the comparative example, while for Example 2, the stress acting on the semiconductor chips of the second layer and the third layer becomes larger than in the comparative example. In the case of Example 2, the improvement in the stress acting on the semiconductor chips is not that clear, but Example 1 shows sufficient superiority over the comparative example.

In this way, it becomes possible to effectively reduce the stress acting on the semiconductor chips carried on the substrates as well by bonding the connection terminals of the adjoining terminals displaced when mounting the semiconductor devices stacked.

In this way, the method of bonding so that the connection terminals are displaced when mounting semiconductor devices stacked has the action and effect of reducing the stress acting on the connection terminals and reducing the stress acting on the semiconductor devices.

Note that in the above embodiments, when stacking semiconductor devices 10, the bonding positions of the connection terminals 14 are arranged successively displaced in one direction such as the inside-inside-inside or outside-outside-outside toward the bottom layer to the top layer, but the bonding positions of the connection terminals 14 are not limited to displacement in only one direction. It is also possible to arrange the terminals displaced alternately to the inside and outside, that is displaced in the layers inside-inside-outside, outside-outside-inside, or inside-outside-inside. Further, the invention is not limited to symmetrical displacement of the connection terminals 14 at facing positions in a single semiconductor device. It is also possible to arrange the connection terminals 14 of the facing positions displaced asymmetrically.

Above, the explanation was made of the semiconductor chips and connection terminals arranged on the same surfaces of the substrates, but the equivalent effect of the present invention can be obtained when the semiconductor chips and connection terminals are arranged on opposite surfaces of the substrates.

According to the mounting structure of the present invention, as explained above, it is possible to effectively relieve the stress acting on the connection terminals when mounting semiconductor devices stacked on a mounting substrate and possible to suitably enhance the reliability of the connections between the mounting substrate and the semiconductor devices. Further, it is possible to reduce the stress acting on the semiconductor chips of the semiconductor devices at the time of actual mounting and possible to improve the reliability of the semiconductor devices While the invention has been described with reference to specific embodiments chosen for purpose of illustration, it should be apparent that numerous modifications could be made thereto by those skilled in the art without departing from the basic concept and scope of the invention.

The present disclosure relates to subject matter contained in Japanese Patent Application No. 2000-383746, filed on Dec. 18, 2000, the disclosure of which is expressly incorporated herein by reference in its entirety.

What is claimed is:

1. A mounting structure for semiconductor devices comprising:

a plurality of semiconductor devices each comprised of a semiconductor chip carried on a substrate and provided with connection terminals formed in bump shapes on the substrate, said semiconductor devices being stacked in multiple layers in the vertical direction and mounted on a mounting substrate by electrically connecting adjoining semiconductor devices through said connection terminals, wherein the connection terminals of the adjoining semiconductor devices are arranged to overlap each other, and either the connection terminals in a layer of a semiconductor device are displaced inwardly with respect to the connection terminals in an adjoining layer of a semiconductor device, or the connection terminals in a layer of a semiconductor device are displaced outwardly with respect to the connection terminals in an adjoining layer of a semiconductor device, and the connection terminals of adjoining semiconductor devices are arranged to be displaced from each other in planar arrangement.

2. A mounting structure for semiconductor devices as set forth in claim 1, wherein said connection terminals are arranged such that the connection terminals in a layer of a semiconductor device are displaced inwardly with respect to the connection terminals in an underlying layer of a semiconductor device.

3. A mounting structure for semiconductor devices as set forth in claim 1, wherein said connection terminals are arranged such that the connection terminals in a layer of a semiconductor device are displaced outwardly with respect to the connection terminals in an underlying layer of a semiconductor device.

4. A mounting structure for semiconductor devices as set forth in claim 1, wherein said connection terminals are arranged such that the connection terminals in a layer of a semiconductor device are displaced inwardly with respect to the connection terminals in an underlying layer of a semiconductor device, and the connection terminals in another layer of a semiconductor device are displaced outwardly with respect to the connection terminals in an underlying layer of a semiconductor device.

5. A mounting structure for semiconductor devices as set forth in claim 1, wherein said semiconductor chips and connection terminals are arranged on the same surface of the substrate.

6. A mounting structure for semiconductor devices as set forth in claim 1, wherein said semiconductor chips and connection terminals are arranged on opposite surfaces of the substrate.

7. A mounting structure for semiconductor devices as set forth in any one of claims 1 to 6, wherein each of the semiconductor devices is formed with interconnection patterns on one surface of its substrate and connection terminals of the adjoining semiconductor devices are electrically connected with said interconnection patterns through connection holes formed passing through said substrates.

* * * * *